United States Patent
Horie

(10) Patent No.: US 11,794,470 B2
(45) Date of Patent: Oct. 24, 2023

(54) PRINT APPARATUS AND HEAD

(71) Applicant: BROTHER KOGYO KABUSHIKI KAISHA, Nagoya (JP)

(72) Inventor: Tsubasa Horie, Obu (JP)

(73) Assignee: BROTHER KOGYO KABUSHIKI KAISHA, Nagoya (JP)

(*) Notice: Subject to any disclaimer, the term of this patent is extended or adjusted under 35 U.S.C. 154(b) by 160 days.

(21) Appl. No.: 17/546,557

(22) Filed: Dec. 9, 2021

(65) Prior Publication Data

US 2022/0203679 A1 Jun. 30, 2022

(30) Foreign Application Priority Data

Dec. 28, 2020 (JP) ................. 2020-219520

(51) Int. Cl.
*B41J 2/045* (2006.01)
*B41J 2/14* (2006.01)
*G01R 27/26* (2006.01)

(52) U.S. Cl.
CPC ......... *B41J 2/04581* (2013.01); *B41J 2/0451* (2013.01); *B41J 2/0455* (2013.01); *B41J 2002/14258* (2013.01); *G01R 27/2605* (2013.01)

(58) Field of Classification Search
CPC ................ B41J 2/14274; B41J 2002/14258
See application file for complete search history.

(56) References Cited

U.S. PATENT DOCUMENTS

| | | | | |
|---|---|---|---|---|
| 6,993,812 B2* | 2/2006 | Takahashi | ........... | B41J 2/14209 29/25.35 |
| 2006/0221142 A1* | 10/2006 | Katayama | ........... | B41J 2/04563 347/68 |
| 2010/0277524 A1* | 11/2010 | Morita | ........... | B41J 2/04581 310/317 |

FOREIGN PATENT DOCUMENTS

JP 2003-347622 A 12/2003

* cited by examiner

*Primary Examiner* — Shelby L Fidler
(74) *Attorney, Agent, or Firm* — KENEALY VAIDYA LLP

(57) ABSTRACT

There is provided print apparatus including: piezoelectric member; individual electrode; first and second common electrodes; voltage application circuit; detection circuit configured to detect a capacitance of a first capacitor configured by the piezoelectric member, the individual electrode, and the first common electrode and a second capacitor configured by the piezoelectric member, the individual electrode, and the second common electrode; first switching element; and control circuit. The control circuit is configured to execute: a first voltage application process to apply a first voltage to the second common electrode in order to discharge the ink; a detection process to detect the capacitance after electrically connecting the piezoelectric member and the detection circuit with the first switching element; and a second voltage application process to apply a second voltage to the second common electrode before the detection process, the second voltage being lower than the first voltage.

11 Claims, 12 Drawing Sheets

FROM INK CARTRIDGE

PRINT APPARATUS AND HEAD

CROSS REFERENCE TO RELATED APPLICATIONS

The present application claims priority from Japanese Patent Application No. 2020-219520, filed on Dec. 28, 2020, the disclosure of which is incorporated herein by reference in its entirety.

BACKGROUND

The present disclosure relates to a print apparatus (printing apparatus) and a head for performing printing by discharging a liquid from a nozzle.

A liquid jetting head has been suggested, which is provided with a piezoelectric element, and a driving electrode and two common electrodes which are provided for the piezoelectric element. For example, the capacitance (electrostatic capacity) of the piezoelectric element is detected in order to detect any defective product in an inspection step during production of the liquid jetting head.

SUMMARY

According to a first aspect of the present disclosure, there is provided a print apparatus including:
 a piezoelectric member configured to be deformed in order to discharge a liquid from a nozzle;
 an individual electrode formed in the piezoelectric member;
 a first common electrode formed in the piezoelectric member;
 a second common electrode formed in the piezoelectric member, a voltage to be applied to the second common electrode being different from a voltage to be applied to the first common electrode;
 a voltage application circuit configured to apply the voltage to the second common electrode;
 a detection circuit configured to detect a capacitance of a first capacitor configured by the piezoelectric member, the individual electrode, and the first common electrode and a second capacitor configured by the piezoelectric member, the individual electrode, and the second common electrode;
 a first switching element connected to the individual electrode and the detection circuit; and
 a control circuit,
 wherein the control circuit is configured to execute:
 a first voltage application process for allowing the voltage application circuit to apply a first voltage to the second common electrode in order to discharge the ink from the nozzle;
 a detection process for allowing the detection circuit to detect the capacitance after electrically connecting the individual electrode and the detection circuit with the first switching element; and
 a second voltage application process for allowing the voltage application circuit to apply a second voltage to the second common electrode before the detection process, the second voltage being lower than the first voltage.

According to a second aspect of the present disclosure, there is provided a print apparatus including:
 a piezoelectric member configured to be deformed in order to discharge a liquid from a nozzle;
 an individual electrode formed in the piezoelectric member;
 a first common electrode formed in the piezoelectric member;
 a second common electrode formed in the piezoelectric member, a voltage to be applied to the second common electrode being different from a voltage to be applied to the first common electrode;
 a detection circuit configured to detect a capacitance of a first capacitor configured by the piezoelectric member, the individual electrode, and the first common electrode and a second capacitor configured by the piezoelectric member, the individual electrode, and the second common electrode;
 a switching element connected to the individual electrode and the detection circuit;
 a generation circuit configured to generate a waveform signal for deforming the piezoelectric member; and
 a control circuit,
 wherein:
 the generation circuit has a switching circuit connected to the second common electrode and ground, and
 the control circuit is configured to execute;
 a first connecting process for connecting the second common electrode and the ground via the switching circuit;
 a second connecting process for connecting the individual electrode and the detection circuit via the switching element after executing the first connecting process; and
 a detection process for allowing the detection circuit to detect the capacitance after executing the second connecting process.

According to a third aspect of the present disclosure, there is provided a head including:
 a piezoelectric member configured to be deformed in order to discharge a liquid from a nozzle;
 an individual electrode formed in the piezoelectric member;
 a first common electrode formed in the piezoelectric member;
 a second common electrode formed in the piezoelectric member, a voltage to be applied to the second common electrode being different from a voltage to be applied to the first common electrode;
 a detection circuit configured to detect a capacitance of a first capacitor configured by the piezoelectric member, the individual electrode, and the first common electrode and a second capacitor configured by the piezoelectric member, the individual electrode, and the second common electrode;
 a switching element connected to the individual electrode and the detection circuit;
 a generation circuit configured to generate a waveform signal for deforming the piezoelectric member; and
 a control circuit,
 wherein:
 the generation circuit has a switching circuit connected to the second common electrode and ground, and
 the control circuit is configured to execute:
 a first connecting process for connecting the second common electrode and the ground via the switching circuit;
 a second connecting process for connecting the individual electrode and the detection circuit via the switching element after executing the first connecting process; and a detection process for allowing the detection circuit to detect the capacitance after executing the second connecting process.

DETAILED DESCRIPTION

When the capacitance is detected, it is desirable to avoid any destruction of a detecting unit for detecting the capacitance.

The present disclosure has been made taking the foregoing circumstances into consideration, an object of which is to provide a print apparatus and a head which make it possible to reduce the load exerted on a detection circuit when the capacitance is detected.

In the case of the print apparatus and the head according to the aspects of the present disclosure, the voltage of the second common electrode is lowered before allowing the detection circuit to detect the capacitance. Thus, when the detection circuit is connected to the piezoelectric member in order to detect the capacitance, it is possible to reduce the load exerted on the detection circuit.

First Embodiment

Figure 1:
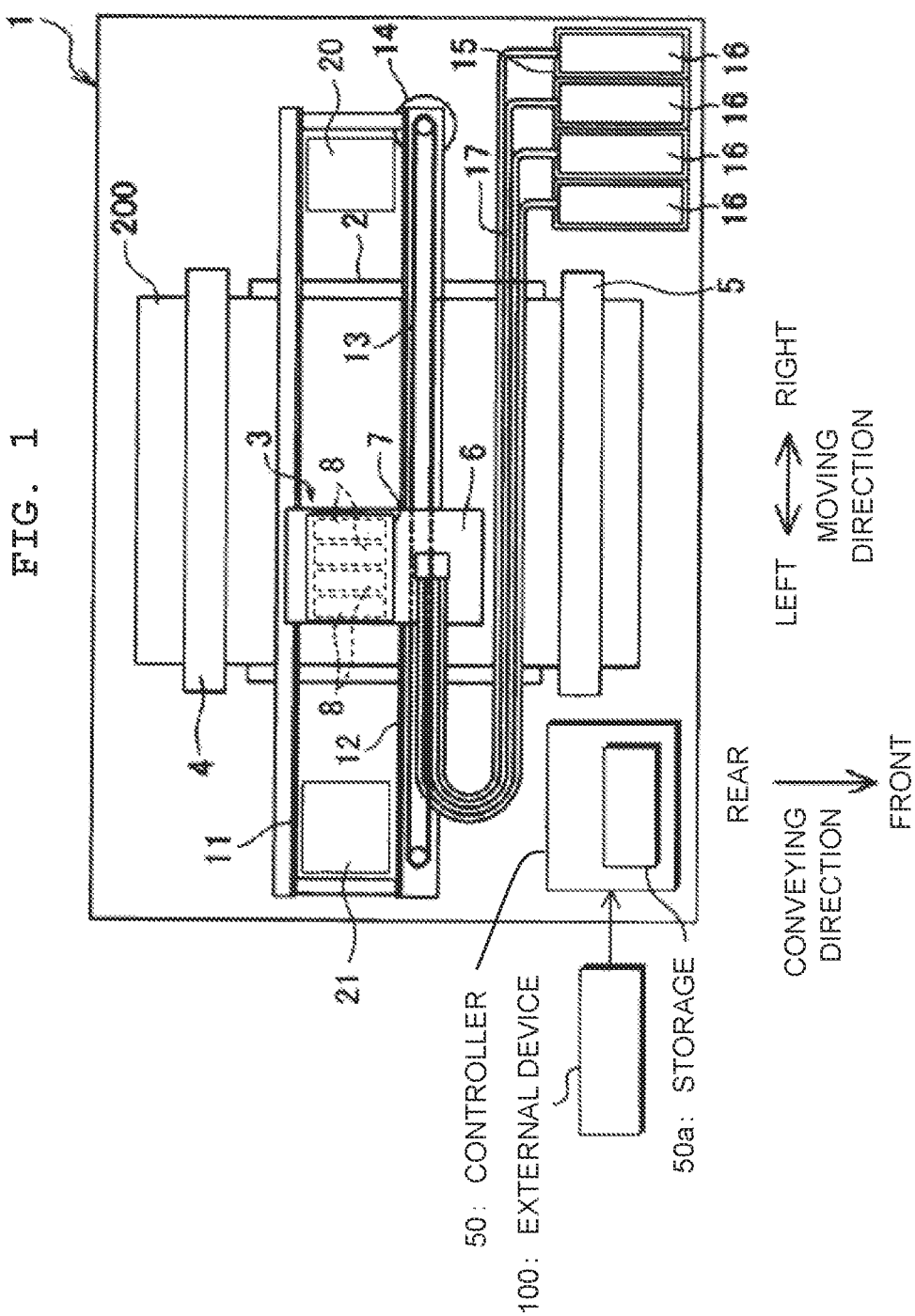
FIG. 1 is a plan view schematically illustrative of a print apparatus.
Figure 2:
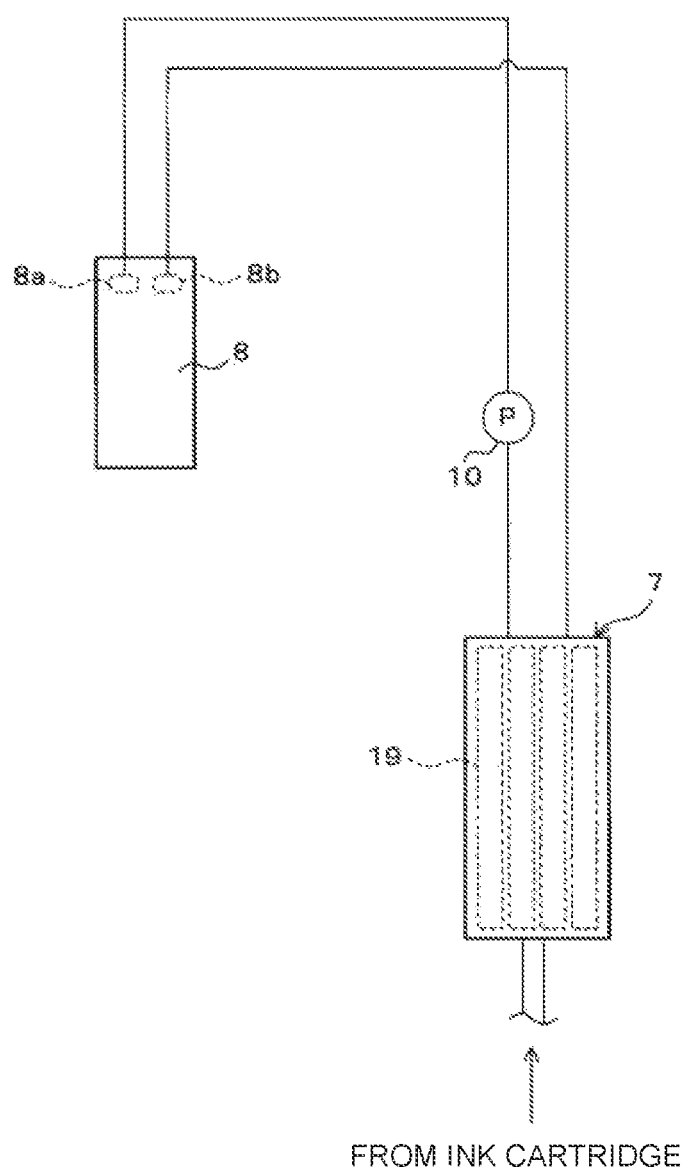
FIG. 2 is an explanatory drawing illustrative of the flow of an ink between a subtank and an ink-jet head.

A print apparatus according to a first embodiment of the present disclosure will be explained below on the basis of the drawings. FIG. 1 is a plan view schematically illustrative of the print apparatus, and FIG. 2 is an explanatory drawing illustrative of the flow of an ink between a subtank and an ink-jet head. In the following description, the front-rear (back) direction and the left-right direction shown in FIG. 1 are used. The front-rear direction corresponds to the conveying direction, and the left-right direction corresponds to the moving direction. Further, the front side of FIG. 1 corresponds to the upper side, and the back side corresponds to the lower side. In the following description, the upward-downward direction as viewed in FIG. 1 (direction orthogonal to the paper surface of FIG. 1) is also used.

As depicted in FIG. 1, the print apparatus 1 is provided with, for example, a platen 2, an ink discharge device 3, and conveying rollers 4, 5. Recording paper 200 as a recording medium is placed on the upper surface of the platen 2. The ink discharge device 3 discharges inks to the recording paper 200 placed on the platen 2 so that an image is recorded. The ink discharge device 3 is provided with, for example, a carriage 6, a subtank 7, four ink-jet heads 8, and a circulation pump 10.

Two guide rails 11, 12, which extend leftwardly and rightwardly to guide the carriage 6, are provided on the upper side of the platen 2. An endless belt 13, which extends leftwardly and rightwardly, is connected to the carriage 6. The endless belt 13 is driven by a carriage driving motor 14. In accordance with the driving of the endless belt 13, the carriage 6 is reciprocatively moved in the moving direction in the area opposed to the platen 2, while being guided by the guide rails 11, 12.

A cap 20 and a flashing receiver 21 are provided between the guide rails 11, 12. The cap 20 and the flashing receiver 21 are arranged on the lower side as compared with the ink discharge device 3. The cap 20 is arranged at the right end portions of the guide rails 11, 12, and the flashing receiver 21 is arranged at the left end portions of the guide rails 11, 12. Note that the position of the cap 20 and the position of the flashing receiver 21 may be opposite to one another.

The subtank 7 and the four ink-jet heads 8 are carried on the carriage 6, and they are reciprocatively movable in the moving direction together with the carriage 6. The subtank 7 is connected to a cartridge holder 15 via tubes 17. An ink cartridge 16 or ink cartridges 16 for one color or a plurality of colors (four colors in this embodiment) is/are installed to the cartridge holder 15. The four colors are exemplified, for example, by black, yellow, cyan, and magenta.

Four ink chambers 19 are formed at the inside of the subtank 7. The four color inks, which are supplied from the four ink cartridges 16, are stored in the four ink chambers 19 respectively.

The four ink-jet heads 8 are aligned in the moving direction on the lower side of the subtank 7. A plurality of nozzles 80 (FIG. 3) are formed on the lower surface of each of the ink-jet heads 8. As depicted in FIG. 2, one ink-jet head 8 corresponds to the ink of one color, and one ink-jet head 8 is connected to one ink chamber 19. That is, the four ink-jet heads 8 correspond to the inks of four colors respectively, and the four ink-jet heads 8 are connected to the four ink chambers 19 respectively.

An ink supply port 8a and an ink discharge port 8b are provided on the upper surface of the ink-jet head 8. The ink supply port 8a and the ink discharge port 8b are connected to the ink chamber 19, for example, via tubes. A circulating pump 10 is installed between the ink supply port 8a and the ink chamber 19.

The circulating pump 10 is, for example, a tube pump for extruding the liquid contained in a tube by rolling (rubbing, stroking) the tube with a rotor. The circulating pump 10 feeds the ink contained in the ink chamber 19 into the ink-jet head 8.

The ink, which is fed from the ink chamber 19 by the circulating pump 10, passes through the ink supply port 8a, and the ink flows into the ink-jet head 8. The ink is discharged from the nozzles 80. The ink, which is not discharged from the nozzles 80, passes through the ink discharge port 8b, and the ink returns to the ink chamber 19. The ink circulates between the ink chamber 19 and the ink-jet head 8. Note that it is also allowable to use another power source for the circulation, for example, a device which feeds the compressed air into the subtank 7 and which feeds the ink into the ink-jet head 8, in place of the circulating pump 10. The four ink-jet heads 8 discharge the four color inks supplied from the subtank 7 to the recording paper 200, while moving in the moving direction together with the carriage.

As depicted in FIG. 1, the conveying roller 4 is arranged on the upstream side (rear side) in the conveying direction from the platen 2. The conveying roller 5 is arranged on the downstream side (front side) in the conveying direction from the platen 2. The two conveying rollers 4, 5 are synchronously driven by a motor (not depicted). The two conveying rollers 4, 5 convey the recording paper 200 placed on the platen 2, in the conveying direction orthogonal to the moving direction. The print apparatus 1 is provided with a controller 50. The controller 50 is provided with, for example, CPU or a logic circuit (for example, FPGA), a nonvolatile memory, and a storage (storage unit) 50a such as RAM or the like. The controller 50 receives the printing job from the external device (external apparatus) 100, and the controller 50 stores the printing job in the storage 50a. The controller 50 controls the driving of, for example, the ink discharge device 3 and the conveying roller 4 on the basis of the printing job, and the controller 50 executes the printing process.

Figure 3:
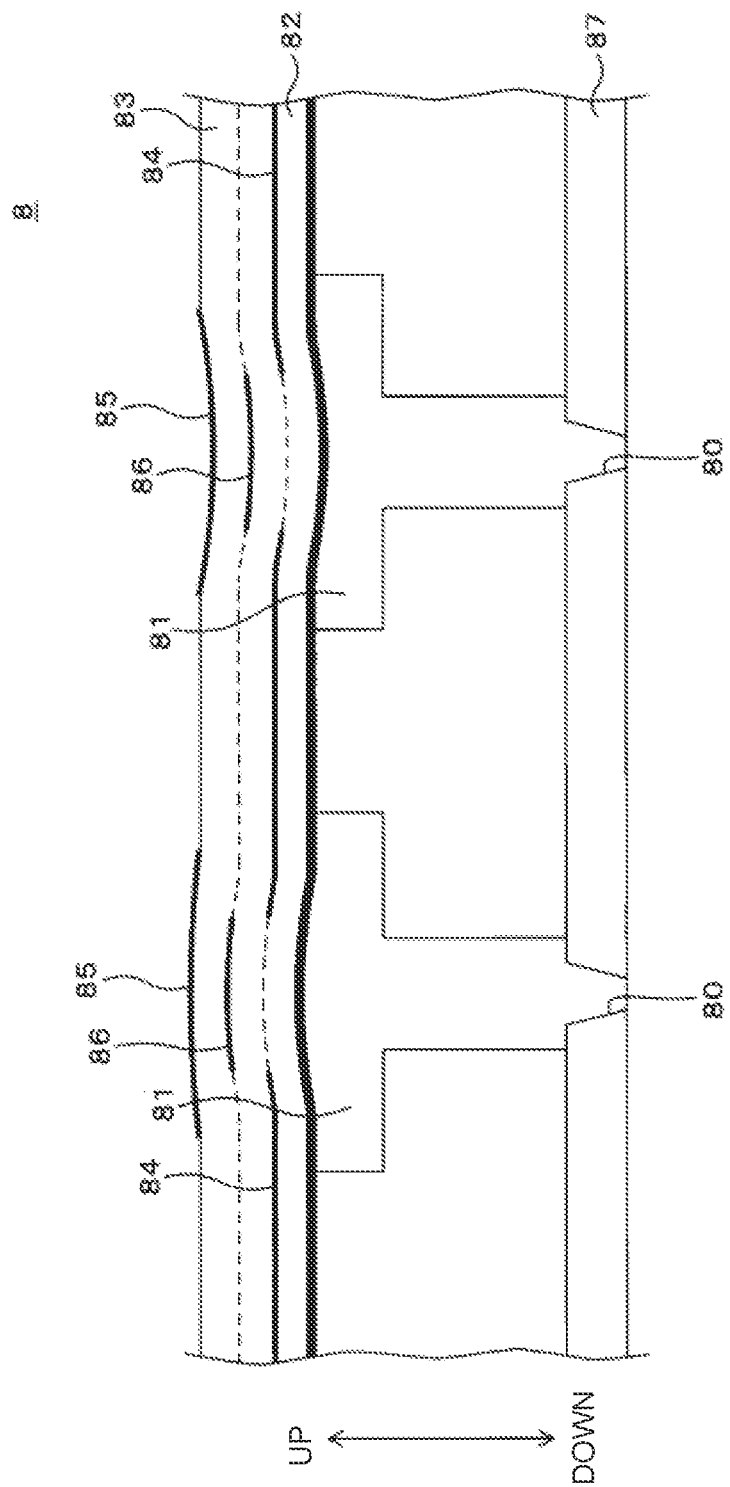
FIG. 3 is a partial enlarged sectional view schematically illustrative of the ink-jet head.

FIG. 3 is a partial enlarged sectional view schematically illustrative of the ink-jet head 8. The ink-jet head 8 is provided with a plurality of pressure chambers 81. The plurality of pressure chambers 81 constitute a plurality of pressure chamber arrays. A vibration plate 82 is formed on the upper side of the pressure chambers 81. A layered piezoelectric member 83 is formed on the upper side of the vibration plate 82. A first common electrode 84 is formed between the piezoelectric member 83 and the vibration plate 82 on the upper side of each of the pressure chambers 81.

A second common electrode 86 is provided at the inside of the piezoelectric member 83. The second common electrode 86 is arranged on the upper side of each of the pressure chambers 81 and on the upper side as compared with the first common electrode 84. The second common electrode 86 is arranged at the position at which the second common electrode 86 is not opposed to the first common electrode 84. An individual electrode 85 is formed on the upper side of each of the pressure chambers 81 on the upper surface of the piezoelectric member 83. The individual electrode 85, the first common electrode 84 and the second common electrode 86 are laminated in the upward-downward direction with the piezoelectric member 83 intervening therebetween.

A nozzle plate 87 is provided under or below each of the pressure chambers 81. A plurality of nozzles 80, which penetrates vertically, are formed through the nozzle plate 87. Each of the nozzles 80 is arranged on the lower side of each of the pressure chambers 81. The plurality of nozzles 80 constitute a plurality of nozzle arrays which extend along with the pressure chamber arrays.

The first common electrode 84 is connected to a COM terminal, i.e., the ground in this embodiment. The second common electrode 86 is connected to a VCOM terminal. The VCOM voltage is higher than the COM voltage. The individual electrode 85 is connected to a switch control unit 67 (see FIG. 5). When the High voltage or Low voltage is applied to the individual electrode 85, the piezoelectric member 83 is deformed, and the vibration plate 82 is vibrated. The ink is discharged from the pressure chamber 81 via the nozzle 80 in accordance with the vibration of the vibration plate 82.

Figure 4:
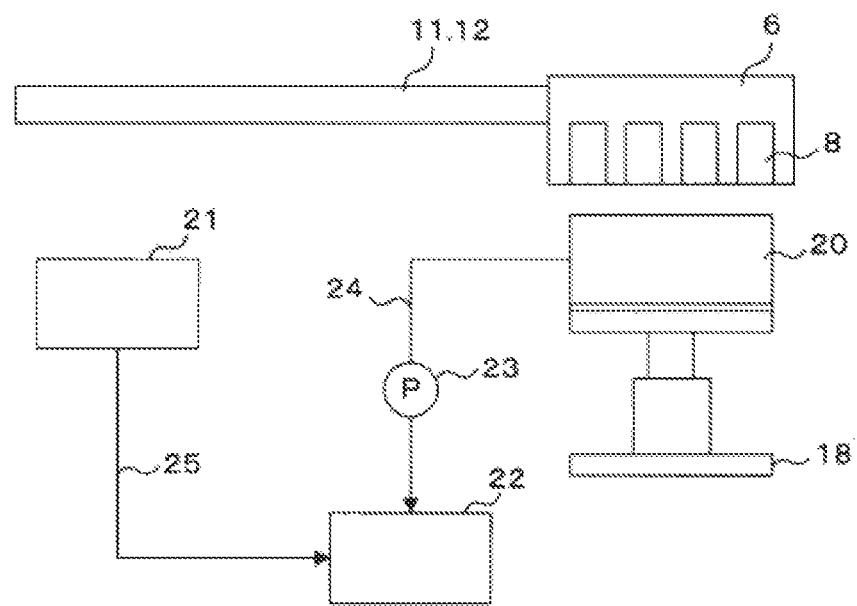
FIG. 4 is an explanatory drawing illustrative of, for example, a cap and an ascending/descending mechanism.

FIG. 4 is an explanatory drawing illustrative of, for example, a cap 20 and an ascending/descending mechanism 18. The ascending/descending mechanism 18 is provided on the lower side of the cap 20. The ascending/descending mechanism 18 supports the cap 20, and the ascending/descending mechanism 18 moves the cap 20 in the upward-downward direction. The cap 20 is connected to a waste liquid tank 22 via a tube 24. The tube 24 is provided with a pump 23. The pump 23 is, for example, a tube pump for extruding the liquid contained in the tube by rolling (rubbing, stroking) the tube with a rotor.

When the suction process is executed for the ink-jet head 8, the carriage 6 is arranged on the upper side of the cap 20. The cap 20 is moved upwardly by the ascending/descending mechanism 18, and the cap 20 is brought in contact with the nozzle plate 87 of the ink-jet head 8. In other words, the cap 20 covers the nozzle plate 87 of the ink-jet head 8. The pump 23 is driven, and the inks are sucked from the ink-jet head 8. The sucked inks are fed to the waste liquid tank 22.

The flashing receiver 21 is connected to the waste liquid tank 22 via a tube 25. When the flashing process is performed, the carriage 6 is arranged on the upper side of the flashing receiver 21. The ink-jet head 8 discharges the inks to the flashing receiver 21. The discharged inks are fed from the flashing receiver 21 to the waste liquid tank 22.

Figure 5:
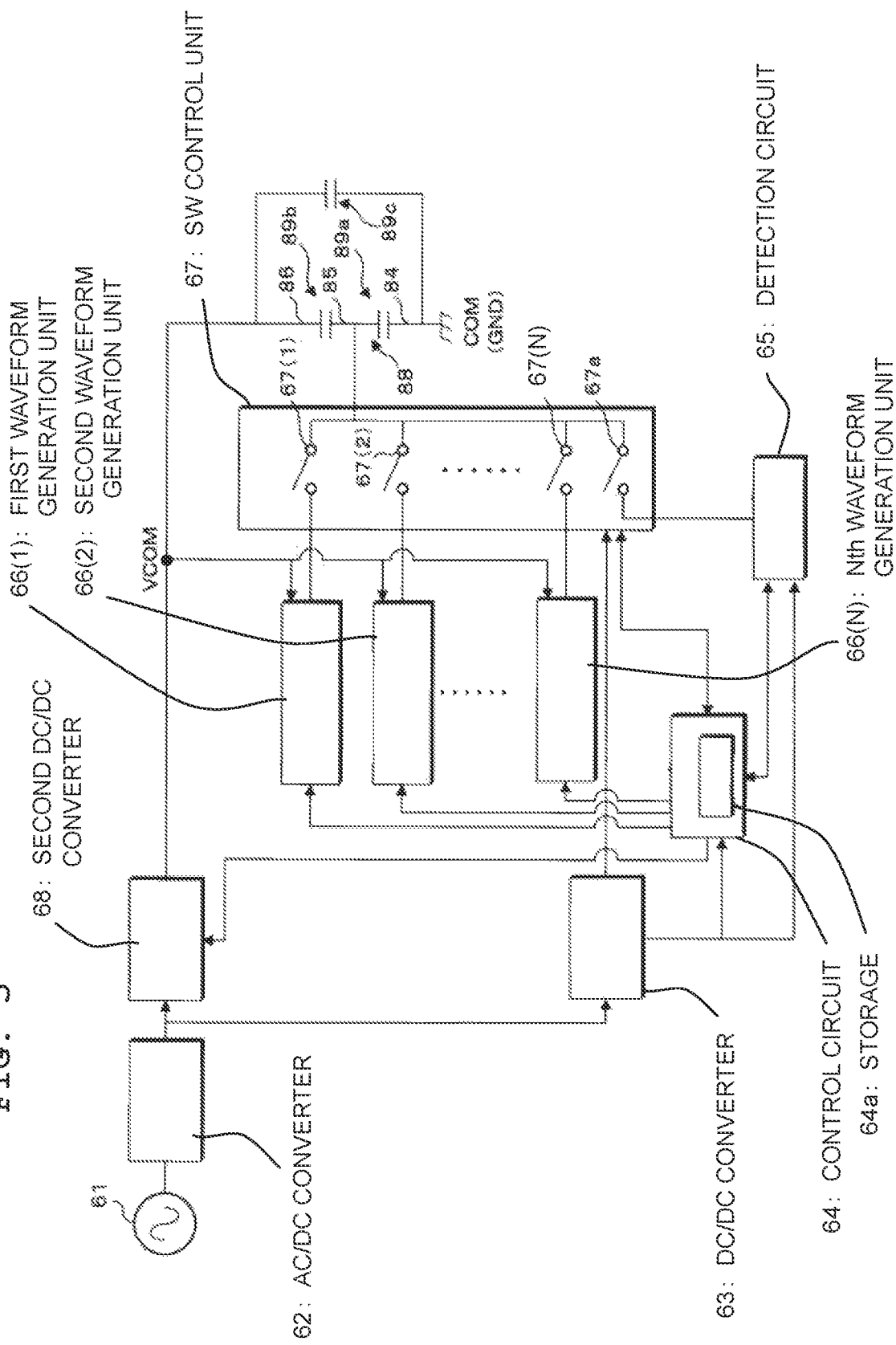
FIG. 5 is a block diagram of the print apparatus.

FIG. 5 is a block diagram of the print apparatus 1. The print apparatus 1 is provided with an AC/DC converter 62 connected to an AC power source 61. The AC/DC converter 62 converts the AC voltage to the DC voltage which is outputted to a DC/DC converter 63. The DC/DC converter 63 changes the voltage, and the changed voltage is outputted to the switch control unit (SW control unit) 67.

For example, a voltage of 42 V is inputted into the DC/DC converter 63, and the DC/DC converter 63 outputs a voltage of 3.3 V or 5.5 V. The output voltage of the DC/DC converter 63 is supplied to a control circuit 64, a detection circuit 65, and the switch control unit 67. The voltage of 3.3 V or 5.5 V is the driving voltage of the control circuit 64, the detection circuit 65, and the switch control unit 67. The voltage, which is smaller than the driving voltage, corresponds to the second voltage.

The switch control unit 67 is provided with a plurality of nth switches $67(n)$ (n=1, 2, . . . , N) and a detecting switch 67a. The detecting switch 67a constitutes a first switching element. The switch control unit 67 constitutes a switching circuit. The plurality of nth switches $67(n)$ and the detecting switch 67a are configured, for example, by an analog switch IC. One end of each of the plurality of nth switches $67(n)$ and one end of the detecting switch 67a are connected to the individual electrode 85 via a common bus.

The other end of each of the plurality of nth switches $67(n)$ is connected to each of a plurality of nth waveform generation (generating) units $66(n)$ (n=1, 2, . . . , N). That is, the first switch 67(1) is connected to the first waveform generation unit (generation circuit) 66(1), the second switch 67(2) is connected to the second waveform generation unit 66(2), and the Nth switch 67(N) is connected to the Nth waveform generation unit 66(N).

The AC/DC converter 62 converts the AC voltage to the DC voltage which is outputted to a second DC/DC converter 68. The second DC/DC converter 68 applies the VCOM voltage to each of the plurality of nth waveform generation units $66(n)$, and the second DC/DC converter 68 applies the VCOM voltage to the second common electrode 86.

A first capacitor 89a is configured by the individual electrode 85, the first common electrode 84, and the piezoelectric member 83. A second capacitor 89b is configured by the individual electrode 85, the second common electrode 86, and the piezoelectric member 83. One end of a retaining capacitor 89c for retaining the electric charge is connected to the first common electrode 84, and the other end of the retaining capacitor 89c is connected to the second common electrode 86. The retaining capacitor 89c retains the VCOM voltage.

The other end of the detecting switch 67a is connected to the detection circuit 65. The detection circuit 65 detects the capacitance of the actuator 88, in other words, the capacitance of (in relation to) the first capacitor 89a and the second capacitor 89b. The print apparatus 1 is provided with the control circuit 64. The control circuit 64 is provided with, for example, CPU, RAM, and a storage (storage unit) 64a. A logic circuit (for example, FPGA) may be provided in place of CPU. The storage 64a is, for example, a rewritable nonvolatile memory, a hard disk or the like. The storage 64a stores, for example, the threshold voltage, the threshold value for making comparison with the capacitance, and the like described later on. The control circuit 64 allows the switch control unit 67 to connect or disconnect (to turn on or turn off) the plurality of nth switches 67(n) and the detecting switch 67a. The control circuit 64 allows each of the plurality of nth waveform generation units 66(n) to output the driving waveform. The plurality of nth waveform generation units 66(n) output the mutually different waveforms respectively. The control circuit 64 allows the detection circuit 65 to detect the capacitance of the actuator 88. The control circuit 64 instructs the second DC/DC converter 68 in relation to the voltage value. The second DC/DC converter 68 outputs the voltage corresponding to the instructed voltage value.

An explanation will be made about a case in which the actuator 88 is driven. For example, when the actuator 88 is driven in accordance with the driving waveform generated by the first waveform generation unit 66(1), the control circuit 64 allows the switch control unit 67 to connect (turn on) only the first switch 67(1) so that the driving waveform is outputted from the first waveform generation unit 66(1) to the actuator 88. In this situation, all of the other switches, i.e., the second switch 67(2), the third switch 67(3), . . . the Nth switch 67(N), and the detecting switch 67a are disconnected (turned off). Note that the process is also executed in the same manner as described above when the actuator 88 is driven by the driving waveform generated by the second waveform generation unit 66(2), the third waveform generation unit 66(3), . . . , or the Nth waveform generation unit 66(N).

An explanation will be made about the circuit operation to detect the capacitance of the actuator 88. The control circuit 64 allows the switch control unit 67 to close only the detecting switch 67a. The detection circuit 65 performs the charge and the discharge, for example, with respect to the first capacitor 89a and the second capacitor 89b so that the capacitance of the actuator 88 is measured. In this situation, all of the plurality of nth switches 67(n), i.e., the first switch 67(1), the second switch 67(2), . . . , and the Nth switch 67(N) are open (turned off).

Figure 6:
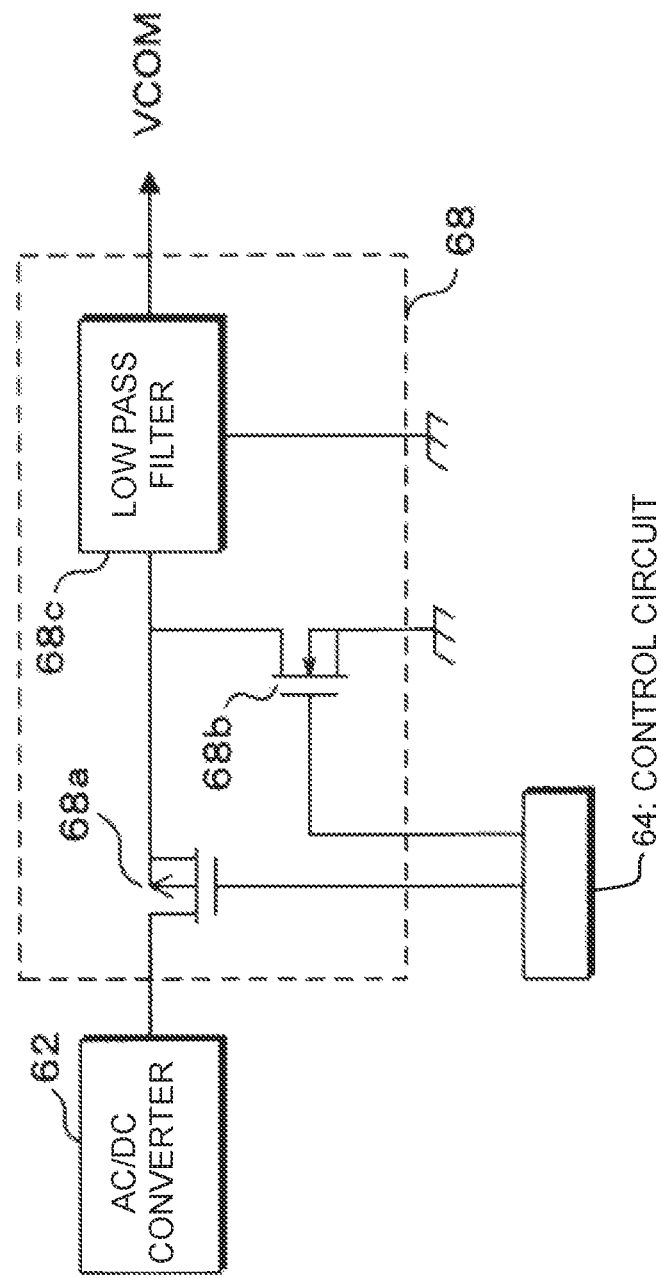
FIG. 6 is a circuit diagram of a second DC/DC converter.

FIG. 6 is a circuit diagram of the second DC/DC converter 68. The second DC/DC converter 68 constitutes a voltage application circuit. The second DC/DC converter 68 is provided with a P-type transistor (PMOS) 68a, an N-type transistor (NMOS) 68b, and a low pass filter 68c. The AC/DC converter 62 is connected to the drain of PMOS 68a, and the low pass filter 68c and the drain of NMOS 68b are connected to the source of PMOS 68a. The source of NMOS 68b is connected to the ground. The control circuit 64 is connected to the gates of PMOS 68a and NMOS 68b respectively. PMOS 68a constitutes a second switching element, and NMOS 68b constitutes a third switching element.

The control circuit 64 switches ON/OFF of PMOS 68a and NMOS 68b to output the voltage from the AC/DC converter 62 to the low pass filter 68c. The voltage is smoothened by the low pass filter 68c, and the voltage is outputted as the VCOM voltage. The output voltage of the second DC/DC converter 68 is adjusted by adjusting the switching time interval of ON/OFF of PMOS 68a and NMOS 68b. In other words, the VCOM voltage is adjusted.

For example, a voltage of 42V is inputted from the AC/DC converter 62 into the second DC/DC converter 68. The second DC/DC converter 68 outputs the VCOM voltage of 0 to 40 V to each of the plurality of nth waveform generation units 66(n) and the second common electrode 86. When the ink is discharged from the nozzle 80, for example, the second DC/DC converter 68 applies a voltage of 30 to 40 V to the second common electrode 86. The voltage, which is applied to the second common electrode 86 in order to discharge the ink from the nozzle 80, corresponds to the first voltage.

Figure 7:
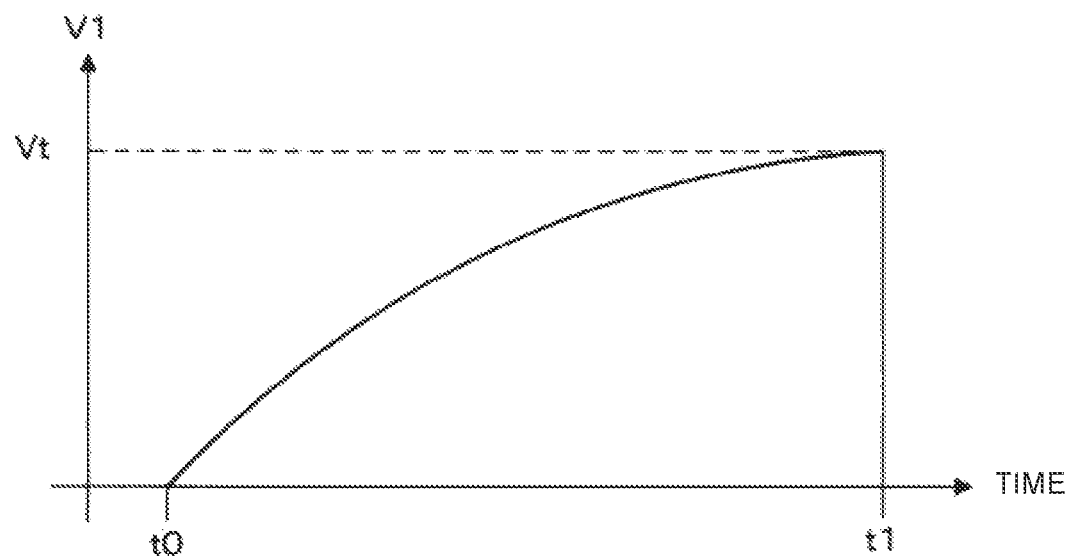
FIG. 7 is an explanatory drawing illustrative of a method for detecting the capacitance by means of a detection circuit.

FIG. 7 is an explanatory drawing illustrative of a method for detecting the capacitance by means of the detection circuit 65. In FIG. 7, the horizontal axis indicates the time, and the vertical axis indicates the voltage V1 of the first capacitor 89a and the second capacitor 89b. The point in time to indicates the point in time at which the trigger signal is inputted into the detection circuit 65 from the control circuit 64, and the point in time t1 indicates the point in time at which the voltage V1 arrives at the threshold voltage Vt.

The control circuit 64 turns ON the detecting switch 67a and turns OFF each of the plurality of nth switches 67(n), and outputs the trigger signal to the detection circuit 65. When the trigger signal is inputted, the detection circuit 65 applies the voltage to the first capacitor 89a and the second capacitor 89b. If the voltage V1 of the first capacitor 89a and the second capacitor 89b arrives at the threshold voltage Vt, the first capacitor 89a and the second capacitor 89b are discharged. Note that the detection circuit 65 is connected to the ground via a switch (not depicted). The electricity is discharged from the first capacitor 89a and the second capacitor 89b by turning ON the switch.

The detection circuit 65 derives the capacitance of (in relation to) the first capacitor 89a and the second capacitor 89b, i.e., the combined capacitance of the first capacitor 89a and the second capacitor 89b on the basis of the time from the point in time t0 to the point in time t1.

The electric charge is retained in the retaining capacitor 89c. It is feared that the electric charge retained in the retaining capacitor 89c may be inputted into the detection circuit 65 so as to damage or destroy the detection circuit 65 when the detecting switch 67a is turned ON. On this account, as described later on, the VCOM voltage of the second common electrode 86 is lowered before the detecting switch 67a is turned ON. The electric charge, which is retained in the first capacitor 89a, the second capacitor 89b, and the retaining capacitor 89c, is released or effused.

Figure 8A:
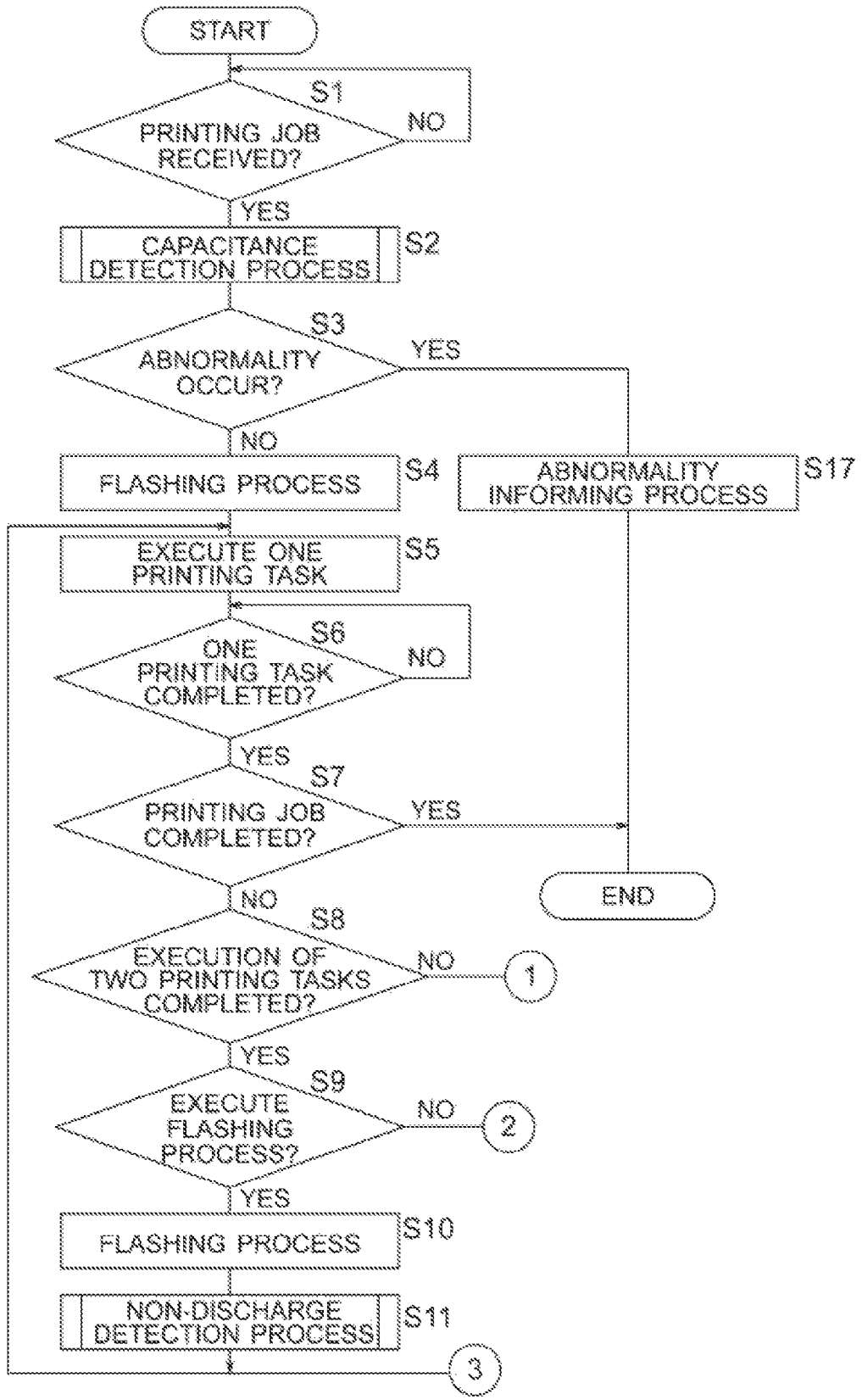
FIGS. 8A and 8B are flow charts illustrative of a printing process controlled by a controller.
Figure 8B:
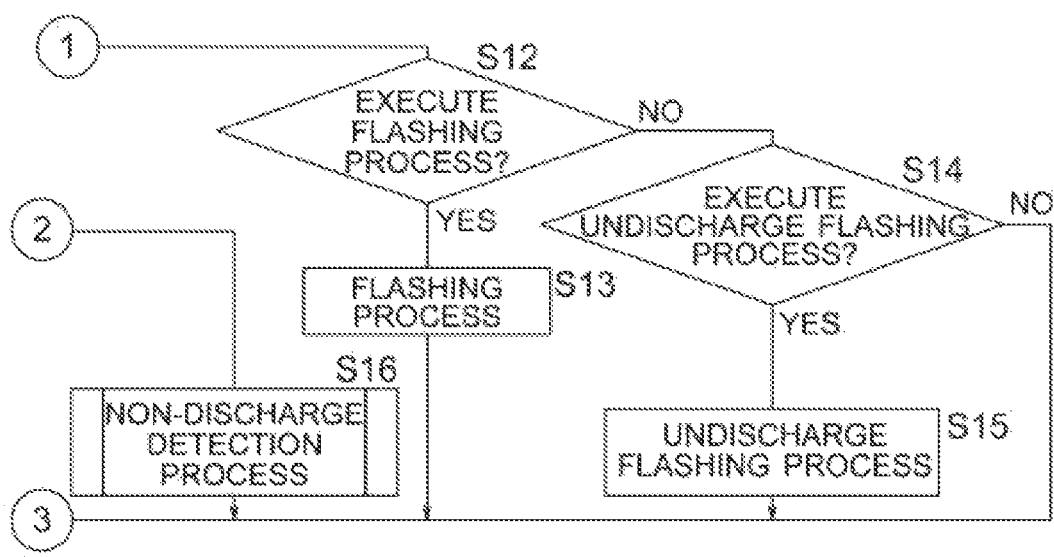

FIGS. 8A and 8B are flow charts illustrative of the printing process controlled by the controller 50. The controller 50 determines whether or not any printing job is received from the external device 100 (S1). If the printing job is not received (S1: NO), the controller 50 returns the process to Step S1. If the printing job is received (S1: YES), the controller 50 allows the control circuit 64 to execute the capacitance detection process (S2). Details of the capacitance detection process will be described later on (see FIG. 9). The controller 50 determines whether or not any abnormality occurs (exists, is present) on the basis of the result of the capacitance detection process (S3). In particular, the controller 50 determines whether or not the calculation to derive the capacitance is impossible on the basis of whether or not the capacitance can be detected. Then, in a case that it is determined that it is impossible to derive the capacitance, it is determined that the abnormality occurs (exists, is present). For example, if the second common electrode 86 or the like has any disconnection, the detection circuit 65 cannot detect the capacitance. On this account, the controller 50 cannot acquire the capacitance from the detection circuit 65 (i.e., the controller 50 cannot derive the capacitance by means of the calculation). If (in a case that) the controller 50 cannot acquire the capacitance from the detection circuit 65, it is speculated that the second common electrode 86 or the like undergoes the disconnection. Therefore, it is impossible to perform the printing in this state. Therefore, it is preferable that the controller 50 informs the user of the abnormality.

If it is determined that the abnormality occurs (S3: YES), then the controller 50 executes the abnormality informing process (S17), and the controller 50 terminates the printing process. In the abnormality informing process, for example, the controller 50 displays the information to indicate the abnormality, for example, on an indication display (not depicted). If it is determined that the abnormality does not occur (S3: NO), the controller 50 executes the flashing process (S4). The flashing process is the process for discharging the ink from the nozzles 80 for the purpose other than the printing.

Subsequently, the controller 50 executes one printing task (S5). The printing task is the unit or component for constructing (configuring) the printing job. Specifically, the printing task resides in (or includes) the liquid discharge process to be performed during the period in which the ink-jet head 8 is moved rightwardly or leftwardly in an amount corresponding to the left-right width of the recording paper 200. In the liquid discharge process, the voltage, which is higher than the driving voltage of the detection circuit 65, is applied to the second common electrode 86. Subsequently, the controller 50 determines whether or not one printing task is completed (S6). If one printing task is not completed (S6: NO), the process is returned to Step S6. If one printing task is completed (S6: YES), the controller 50 determines whether or not the printing job is completed (S7).

If the printing job is completed (S7: YES), the controller 50 terminates the printing process. If the printing job is not completed (S7: NO), the controller 50 determines whether or not two printing tasks are completed (S8). If two printing tasks are completed (S8: YES), the controller 50 determines whether or not the timing is the timing at which the flashing process is to be performed (S9). The flashing process is periodically executed for the maintenance for the nozzles 80. If the timing is the timing at which the flashing process is to be performed (S9: YES), the controller 50 executes the flashing process (S10). The controller 50 allows the control circuit 64 to execute the non-discharge (discharge failure) detection process (S11), and the process is returned to Step S5. Details of the non-discharge detection process will be described later on (see FIG. 10).

In Step S9, if the timing is not the timing at which the flashing process is to be performed (S9: NO), then the controller 50 executes the non-discharge detection process (S16), and the process is returned to Step S5.

In Step S8, if two printing tasks are not completed (S8: NO), the controller 50 determines whether or not the timing is the timing at which the flashing process is to be performed (S12). If the timing is the timing at which the flashing process is to be performed (S12: YES), then the controller 50 executes the flashing process (S13), and the process is returned to Step S5.

In Step S12, if the timing is not the timing at which the flashing process is to be performed (S12: NO), the controller 50 determines whether or not the timing is the timing at which the undischarge flashing process is to be executed (S14). The undischarge flashing process is the process to be performed in order to prevent the nozzles 80 from being dried, without discharging the liquid. In particular, the piezoelectric member 83 is slightly deformed to swing the surface (meniscus) of the liquid in this process. The undischarge flashing process is periodically executed.

If the timing is the timing at which the undischarge flashing process is to be executed (S14: YES), then the controller 50 executes the undischarge flashing process (S15), and the process is returned to Step S5. If the timing is not the timing at which the undischarge flashing process is to be executed (S14: NO), the controller 50 returns the process to Step S5. Note that in Step S8, there is no limitation to two printing tasks. It is also allowable to determine whether or not one printing task or three or more printing tasks is/are completed.

Figure 9:
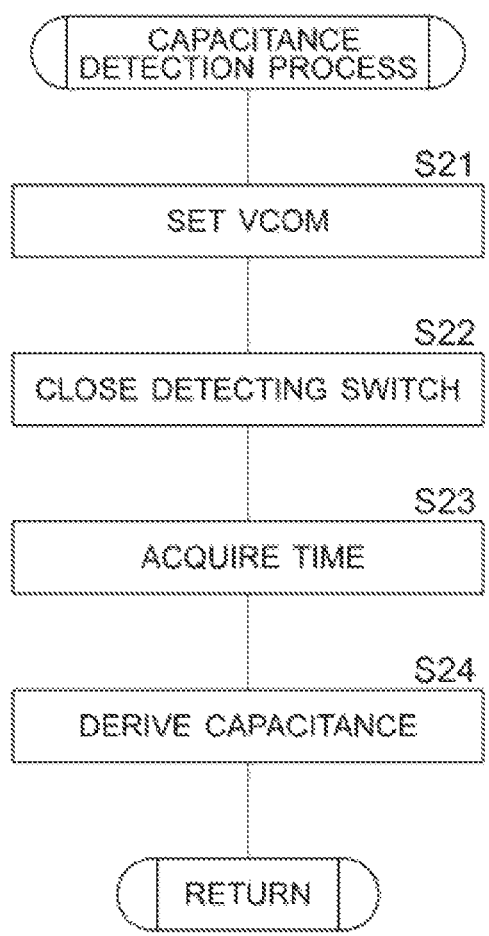
FIG. 9 is a flow chart illustrative of a capacitance detection process controlled by a control circuit.

FIG. 9 is a flow chart illustrative of a capacitance detection process controlled by the control circuit 64. The control circuit 64 allows the second DC/DC converter 68 to set the VCOM voltage (S21). The second DC/DC converter 68 applies the VCOM voltage to the plurality of nth waveform generation units 66($n$) and the second common electrode 86. The VCOM voltage is not less than 0 V and less than the driving voltage of the detection circuit 65.

Subsequently, the control circuit 64 closes (turns on) the detecting switch 67*a* (S22) for electrically connecting the individual electrode 85 and the detection circuit 65, and the control circuit 64 acquires the time from the point in time t0 to the point in time t1 (S23). The control circuit 64 derives the capacitance on the basis of the acquired time (S24), and the control circuit 64 returns the process.

Figure 10:
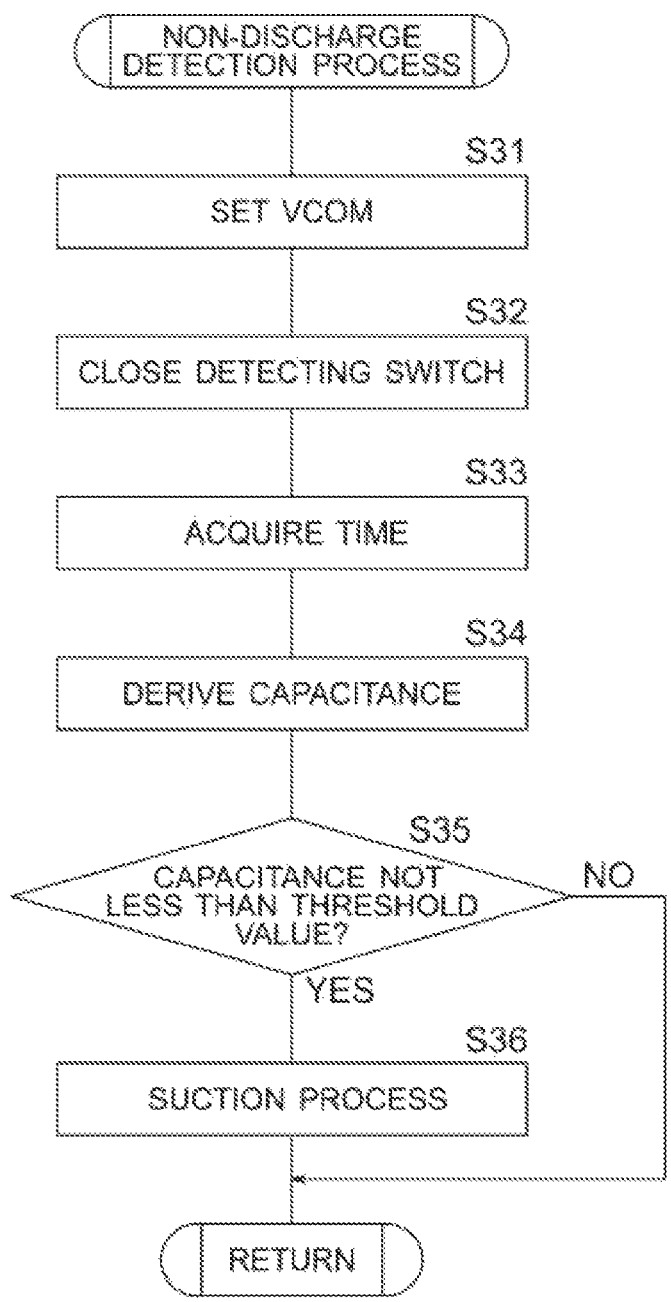
FIG. 10 is a flow chart illustrative of a non-discharge (discharge failure) detection process controlled by the control circuit.

FIG. 10 is a flow chart illustrative of the non-discharge (discharge failure) detection process controlled by the control circuit 64. The control circuit 64 allows the second DC/DC converter to set the VCOM voltage (S31). The second DC/DC converter applies the VCOM voltage. The VCOM voltage is not more than a half of the driving voltage of the detection circuit 65 and preferably 0 V. If the VCOM voltage is set to 0 V, then the control circuit 64 turns OFF PMOS 68*a*, and the control circuit 64 turns ON NMOS 68*b* so that the VCOM voltage is lowered to 0 V thereby (see FIG. 6).

Subsequently, the control circuit 64 closes the detecting switch 67*a* (S32), and the control circuit 64 acquires the time from the point in time t0 to the point in time t1 (S33). The control circuit 64 derives the capacitance of the actuator 88 on the basis of the acquired time (S34). The control circuit 64 determines whether or not the derived capacitance is not less than a threshold value (S35).

If the capacitance is less than the threshold value (S35: NO), the control circuit 64 returns the process. If the capacitance is not less than the threshold value (S35: YES), then the control circuit 64 executes the suction process (S36), and the control circuit 64 returns the process. Note that in Step S36, the flashing process may be executed in place of the suction process. The non-discharge detection process is executed simultaneously for the plurality of nozzles 80.

Note that the following procedure is also available. That is, a first threshold value and a second threshold value larger than the first threshold value are previously stored in the storage unit 64a. If the derived capacitance is not less than the first threshold value and less than the second threshold value in Step S35, the control circuit 64 executes the flashing process in Step S36. If the derived capacitance is not less than the second threshold value in Step S35, the control circuit 64 executes the suction process in Step S36. In this case, if the derived capacitance of the actuator 88 is less than the first threshold value in Step S35, the process is returned.

In the first embodiment, the voltage of the second common electrode 86 is lowered before allowing the detection circuit 65 to detect the capacitance of the actuator 88. For example, the second voltage, which is lower than the first voltage applied to the second common electrode 86 in order to discharge the inks from the nozzles 80, is applied to the second common electrode 86. Accordingly, when the detection circuit 65 is connected to the piezoelectric member 83 in order to detect the capacitance, it is possible to reduce the load exerted on the detection circuit 65.

Further, the second voltage is not less than 0 volt and less than the driving voltage of the detection circuit 65 (for example, 3.3 V or 5.5 V), and thus it is possible to realize the reduction of the load exerted on the detection circuit 65.

Further, the controller 50 determines whether or not the calculation to derive the capacitance is impossible on the basis of whether or not the capacitance of the actuator 88 can be detected after receiving the printing command. If it is determined that it is impossible to derive the capacitance of the actuator 88, the controller 50 executes the abnormality informing process. Accordingly, the user can perceive the abnormality.

The second voltage is not less than 0 volt and not more than the half of the driving voltage of the detection circuit, and thus it is possible to further reduce the load exerted on the detection circuit 65.

Further, the controller 50 executes the non-discharge detection process after the completion of the printing job. If it is determined that the capacitance is not less than the threshold value, i.e., if it is determined that the non-discharge occurs, then the flashing process or the suction process is executed, and thus it is possible to dissolve the non-discharge of the nozzles 80.

Further, the second voltage is 0 volt, and thus it is possible to further reduce the load exerted on the detection circuit 65.

Further, when the capacitance is derived, then PMOS 68a is turned OFF, and NMOS 68b is turned ON before connecting the detection circuit 65 to the second common electrode 86. In other words, PMOS 68a is disconnected, and NMOS 68b is connected. Accordingly, the electric charges, which are retained in the first capacitor 89a, the second capacitor 89b, and the retaining capacitor 89c, are released, and it is possible to reduce the load exerted on the detection circuit 65.

Second Embodiment

Figure 11:
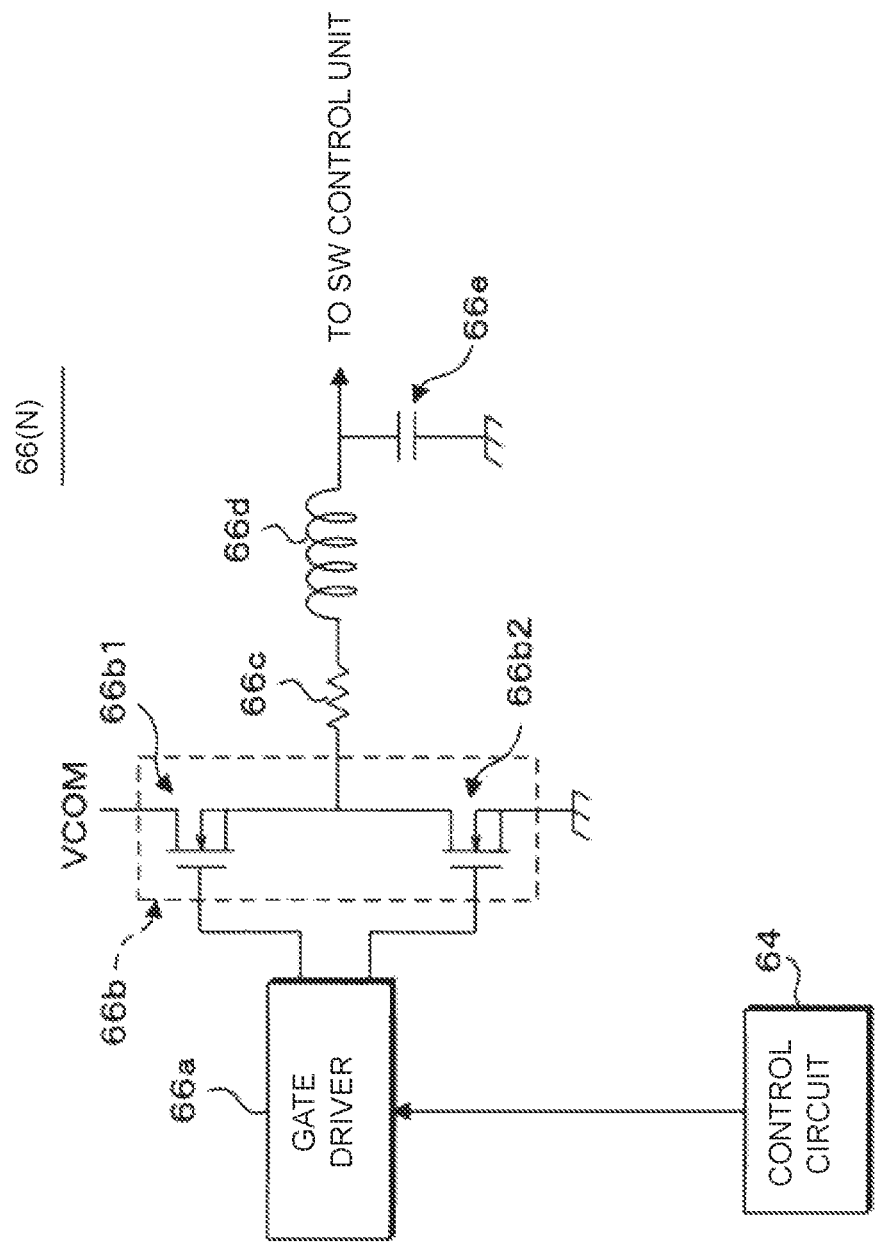
FIG. 11 is a circuit diagram of an Nth waveform generation unit.

FIG. 11 is a circuit diagram of an Nth waveform generation unit 66(N). The Nth waveform generation unit 66(N) is provided with a gate driver 66a, a half bridge circuit 66b, a resistor 66c, an inductor 66d, and a capacitor 66e. A driving signal is inputted into the gate driver 66a from the control circuit 64. The half bridge circuit 66b has NMOS 66b1 and NMOS 66b2. The half bridge circuit 66b constitutes a switching circuit. The gate driver 66a outputs the signal to gates of NMOS 66b1 and NMOS 66b2.

The drain of NMOS 66b1 is connected to the VCOM terminal. The source of NMOS 66b1 is connected to the drain of NMOS 66b2. The source of NMOS 66b2 is connected to the ground. In other words, the half bridge circuit 66b is connected to the VCOM terminal and the ground. The source of NMOS 66b1 and the drain of NMOS 66b2 are connected to one end of the inductor 66d via the resistor 66c. One end of the capacitor 66e is connected to the other end of the inductor 66d, and the other end of the capacitor 66e is connected to the ground. A waveform signal is outputted to the switch control unit 67 from a portion between the inductor 66d and the capacitor 66e. Note that the waveform signal has a waveform of the High voltage or Low voltage applied to the individual electrode 85, which deforms the piezoelectric member 83.

As described above, if the VCOM voltage is 0 V in Step S31 (see FIG. 10), then the control circuit 64 turns OFF PMOS 68a, and the control circuit 64 turns ON NMOS 68b. In the second embodiment, the control circuit 64 further alternately turns ON and OFF NMOS 66b1 and NMOS 66b2. That is, the control circuit 64 repeats the state in which NMOS 66b1 is turned ON and NMOS 66b2 is turned OFF and the state in which NMOS 66b1 is turned OFF and NMOS 66b2 is turned ON so that the VCOM voltage is 0 V. NMOS 66b1 and NMOS 66b2 are alternately turned ON and OFF, and thus the VCOM voltage can be gradually lowered.

In the second embodiment, the control circuit 64 allows the VCOM terminal to be connected to the ground by the aid of (via) the half bridge circuit 66b before deriving the capacitance of the actuator 88. The VCOM terminal is connected to the ground by using the half bridge circuit 66b in addition to the procedure in which PMOS 68a is turned OFF and NMOS 68b is turned ON, and thus the VCOM voltage can be lowered to a desired voltage in a short period of time.

Note that it is also allowable that the control circuit 64 does not use PMOS 68a and NMOS 68b of the second DC/DC converter 68 in order to lower the VCOM voltage. That is, the VCOM voltage may be lowered by merely connecting the VCOM terminal to the ground by the aid of the half bridge circuit 66b. Also in this case, it is possible to reduce the load exerted on the detection circuit 65, by releasing the electric charges retained by the first capacitor 89a, the second capacitor 89b, and the retaining capacitor 89c.

Further, in addition to alternately turning on and turning off the NMOS 66b1 and NMOS 66b2 of the Nth waveform generation unit 66(N), the VCOM terminal may be connected to the ground by using the half bridge circuit 66b of each of the plurality of nth waveform generation units 66(n). In other words, for example, NMOS 66b1 and NMOS 66b2 may be alternately turned ON and OFF in the first waveform generation unit 66(1), and NMOS 66b1 and NMOS 66b2 may be alternately turned ON and OFF in the second waveform generation unit 66(2) so as to lower the COM voltage to 0 V. The electric charges, which are retained in the first capacitor 89a, the second capacitor 89b, and the retaining capacitor 89c, are released more easily by using the plurality of half bridge circuits 66b, and the load exerted on the detection circuit 65 is reduced more easily. Note that the VCOM terminal may be connected to the ground by using only the half bridge circuit 66b of each of the plurality of nth waveform generation units 66(n) without using PMOS 68a and NMOS 68b of the second DC/DC converter 68.

It should be understood that the embodiments disclosed herein are exemplified by way of example in relation to all of the viewpoints, and the embodiments are not restrictive. The technical features described in the respective embodiments can be combined with each other. It is intended that the scope of the present invention includes all changes or alterations included in claims and equivalent ranges equivalent to claims.

What is claimed is:

1. A print apparatus comprising:
a piezoelectric member configured to be deformed in order to discharge a liquid from a nozzle;
an individual electrode formed in the piezoelectric member;
a first common electrode formed in the piezoelectric member;
a second common electrode formed in the piezoelectric member, a voltage to be applied to the second common electrode being different from a voltage to be applied to the first common electrode;
a voltage application circuit configured to apply the voltage to the second common electrode;
a detection circuit configured to detect a capacitance of a first capacitor configured by the piezoelectric member, the individual electrode, and the first common electrode and a second capacitor configured by the piezoelectric member, the individual electrode, and the second common electrode;
a first switching element connected to the individual electrode and the detection circuit; and
a control circuit,
wherein the control circuit is configured to execute;
a first voltage application process for allowing the voltage application circuit to apply a first voltage to the second common electrode in order to discharge the ink from the nozzle;
a detection process for allowing the detection circuit to detect the capacitance after electrically connecting the individual electrode and the detection circuit with the first switching element; and
a second voltage application process for allowing the voltage application circuit to apply a second voltage to the second common electrode before the detection process, the second voltage being lower than the first voltage.

2. The print apparatus according to claim 1, wherein the second voltage is not less than 0 volt and less than a driving voltage of the detection circuit.

3. The print apparatus according to claim 1, wherein the control circuit executes:
determining process for determining whether the capacitance of the first capacitor and the second capacitor can be detected after receiving a printing command; and
an informing process in a case that the capacitance of the first capacitor and the second capacitor cannot be detected.

4. The print apparatus according to claim 1, wherein the second voltage is not less than 0 volt and not more than a half of a driving voltage of the detection circuit.

5. The print apparatus according to claim 1, further comprising:
a cap configured to cover the nozzle;
a pump; and
a tube provided with the pump,
wherein the control circuit is configured to execute:
a deriving process for deriving the capacitance after completing printing;
a determining process for determining whether or not the capacitance is not less than a threshold value; and
a flashing process for discharging the liquid from the nozzle, or a suction process for sucking the liquid from the nozzle by driving the pump after covering the nozzle with the cap, in a case that the capacitance is determined to be not less than the threshold value.

6. The print apparatus according to claim 1, wherein the second voltage is 0 volt.

7. The print apparatus according to claim 1, wherein the voltage application circuit has:
a second switching element connected to a power source and the second common electrode; and
a third switching element connected to ground and a portion between the second switching element and the second common electrode; and
the control circuit is configured to disconnect the second switching element, and connect the third switching element, before the control circuit derives the capacitance of the first capacitor and the second capacitor.

8. The print apparatus according to claim 7, further comprising:
a generation circuit configured to generate a voltage waveform for deforming the piezoelectric member,
wherein:
the generation circuit has a switching circuit connected to the second common electrode and the ground; and
the control circuit lowers the voltage to be applied to the second common electrode by using the switching circuit before the control circuit derives the capacitance of the first capacitor and the second capacitor.

9. The print apparatus according to claim 1, further comprising:
a plurality of generation circuits each configured to generate a waveform signal for deforming the piezoelectric member,
wherein:
each of the plurality of generation circuits has one of a plurality of switching circuits each connected to the second common electrode and the ground; and
the control circuit connects the second common electrode and the ground via each of the plurality of switching circuits before the control circuit derives the capacitance of the first capacitor and the second capacitor.

10. A print apparatus comprising:
a piezoelectric member configured to be deformed in order to discharge a liquid from a nozzle;
an individual electrode formed in the piezoelectric member;
a first common electrode formed in the piezoelectric member;
a second common electrode formed in the piezoelectric member, a voltage to be applied to the second common electrode being different from a voltage to be applied to the first common electrode;
a detection circuit configured to detect a capacitance of a first capacitor configured by the piezoelectric member, the individual electrode, and the first common electrode and a second capacitor configured by the piezoelectric member, the individual electrode, and the second common electrode;
a switching element connected to the individual electrode and the detection circuit;
a generation circuit configured to generate a waveform signal for deforming the piezoelectric member; and
a control circuit,
wherein:
the generation circuit has a switching circuit connected to the second common electrode and ground, and
the control circuit is configured to execute;

a first connecting process for connecting the second common electrode and the ground via the switching circuit;

a second connecting process for connecting the individual electrode and the detection circuit via the switching element after executing the first connecting process; and a detection process for allowing the detection circuit to detect the capacitance after executing the second connecting process.

11. A head comprising:

a piezoelectric member configured to be deformed in order to discharge a liquid from a nozzle;

an individual electrode formed in the piezoelectric member;

a first common electrode formed in the piezoelectric member;

a second common electrode formed in the piezoelectric member, a voltage to be applied to the second common electrode being different from a voltage to be applied to the first common electrode;

a detection circuit configured to detect a capacitance of a first capacitor configured by the piezoelectric member, the individual electrode, and the first common electrode and a second capacitor configured by the piezoelectric member, the individual electrode, and the second common electrode;

a switching element connected to the individual electrode and the detection circuit;

a generation circuit configured to generate a waveform signal for deforming the piezoelectric member; and a control circuit, wherein:

the generation circuit has a switching circuit connected to the second common electrode and ground, and the control circuit is configured to execute:

a first connecting process for connecting the second common electrode and the ground via the switching circuit;

a second connecting process for connecting the individual electrode and the detection circuit via the switching element after executing the first connecting process; and a detection process for allowing the detection circuit to detect the capacitance after executing the second connecting process.

\* \* \* \* \*